(12) United States Patent
Kimura

(10) Patent No.: US 9,490,800 B2
(45) Date of Patent: Nov. 8, 2016

(54) CONTROL CIRCUIT OF SEMICONDUCTOR SWITCHING ELEMENT

(71) Applicant: DENSO CORPORATION, Kariya, Aichi-pref. (JP)

(72) Inventor: Tomonori Kimura, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/731,591

(22) Filed: Jun. 5, 2015

(65) Prior Publication Data

US 2015/0381151 A1 Dec. 31, 2015

(30) Foreign Application Priority Data

Jun. 30, 2014 (JP) ................. 2014-134226

(51) Int. Cl.
*H03B 1/00* (2006.01)
*H03K 17/687* (2006.01)

(52) U.S. Cl.
CPC .................... *H03K 17/687* (2013.01)

(58) Field of Classification Search
CPC .................................................... H03K 17/687
See application file for complete search history.

(56) References Cited

U.S. PATENT DOCUMENTS

2009/0033377 A1 2/2009 Hashimoto et al.
2013/0214824 A1* 8/2013 Umetani ............. H03K 17/145
327/109

FOREIGN PATENT DOCUMENTS

JP 2000-059195 A 2/2000

* cited by examiner

*Primary Examiner* — Daniel Puentes
(74) *Attorney, Agent, or Firm* — Posz Law Group, PLC

(57) ABSTRACT

A control circuit of a semiconductor switching element includes a gate driving circuit and a negative power source circuit. The gate driving circuit drives the semiconductor switching element disposed on a power supply path of an inductive load. The negative power source circuit is connected between output terminals of the semiconductor switching element. The negative power source circuit includes a series circuit of a capacitor and a diode in a forward direction connected from a negative potential side terminal to a positive potential side terminal of the output terminals. A common connection point of the capacitor and the diode in the negative power source circuit is connected to a negative power source terminal of the gate driving circuit.

10 Claims, 8 Drawing Sheets

CONTROL CIRCUIT OF SEMICONDUCTOR SWITCHING ELEMENT

CROSS REFERENCE TO RELATED APPLICATIONS

The present application is based on and claims priority to Japanese Patent Application No. 2014-134226 filed on Jun. 30, 2014, the disclosure of which is incorporated herein by reference.

TECHNICAL FIELD

The present disclosure relates to a control circuit of a semiconductor switching element.

BACKGROUND

A normally-off semiconductor switching element made of gallium nitride (GaN), which is one of a power device, is capable of performing a high-speed switching operation. However, because a gallium nitride element has a threshold voltage of, for example, about 1 V, which is lower than a threshold voltage of a normal FET mainly made of silicon, a malfunction is likely to be caused by influence of noise in association with a switching operation.

Thus, in a gate driving circuit of a gallium nitride element, an off-holding voltage is set to be negative with respect to a source of the gallium nitride element, so as to restrict a malfunction. In such a case, while a gate driving circuit of the normal FET uses a positive single power source, the gate driving circuit of the gallium nitride element requires an additional negative power source for the off-holding at the negative voltage. Thus, an increase in cost is inevitable, and a size of the gate driving circuit also increases.

On the other hand, JP 2009-21823 A (corresponding to US 2009/0033377 A1) and JP 2000-59195 A disclose to generate a negative voltage from a single power source by adding a charge pump function to a gate driving circuit, instead of providing a negative power source. Accordingly, in the gate driving circuit generating the negative power source, the negative voltage is the same voltage as the single power source. However, when the negative voltage for the off-holding is applied to the gallium nitride element as an offset at a reverse conduction, a loss at the reverse conduction increases. Furthermore, because a semiconductor switching element is added for generating the negative voltage, a control may be complicated.

SUMMARY

It is an object of the present disclosure to provide a control circuit that can generate an appropriate negative voltage with respect to a semiconductor switching element operating at a low voltage, such as a gallium nitride element, without providing an additional power source.

A control circuit of a semiconductor switching element according to an aspect of the present disclosure includes a gate driving circuit and a negative power source circuit. The gate driving circuit drives the semiconductor switching element disposed on a power supply path of an inductive load. The negative power source circuit is connected between output terminals of the semiconductor switching element. The negative power source circuit includes a series circuit of a capacitor and a diode in a forward direction connected from a negative potential side terminal to a positive potential side terminal of the output terminals. A common connection point of the capacitor and the diode in the negative power source circuit is connected to a negative power source terminal of the gate driving circuit.

According to the control circuit, in a state where the semiconductor switching element is held in an off-state by the gate driving circuit, when the semiconductor switching elements becomes a reverse conducting state due to a load current that flows to the inductive load, the load current also flows to the negative power source circuit due to an offset voltage of the semiconductor switching element, and the capacitor is charged. When the above-described operation is repeated and the charge of the capacitor proceeds, a terminal voltage of the capacitor increases, and a negative potential can be given to the gate driving circuit. Accordingly, the semiconductor switching element is held in the off-state by the negative potential generated by the negative power source circuit, a malfunction due to, for example, noise, can be restricted, and a stable operation can be performed.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION (First Embodiment)

Figure 1:
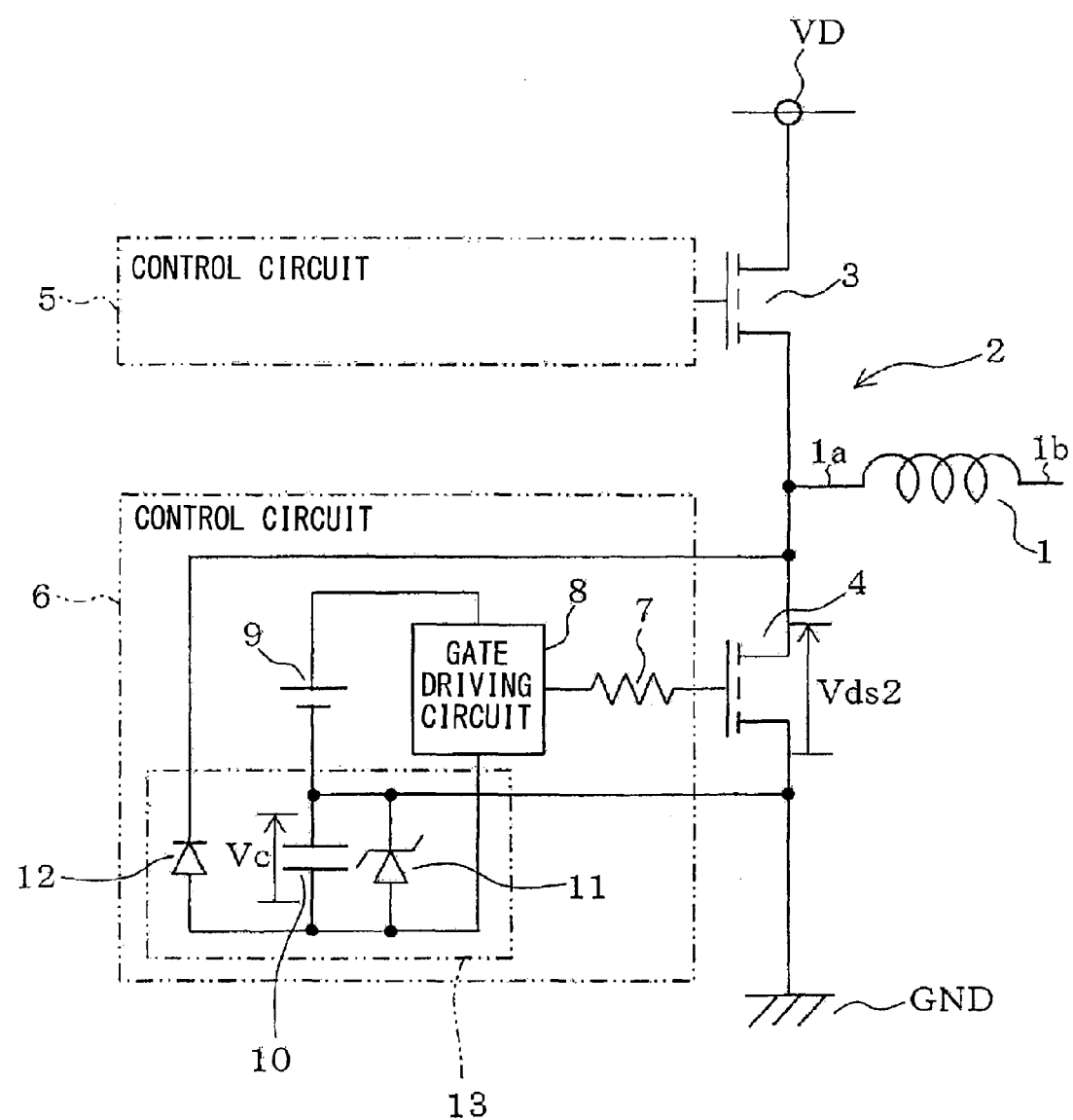
FIG. 1 is a diagram illustrating an electrical configuration of a first embodiment.

A first embodiment of the present disclosure will be described with reference to FIG. 1 to FIG. 3. As illustrated in FIG. 1, a half bridge circuit 2 supplies power to a coil 1 as an inductive load. The half bridge circuit 2 includes two gallium nitride (GaN) elements 3, 4 as semiconductor switching elements. The GaN element 3 corresponds to a first semiconductor switching element, the GaN element 4 corresponds to a second semiconductor switching element, and the GaN element 3 is disposed on a higher voltage side than the GaN element 4. Drains and sources of the two GaN elements 3, 4 are connected in series between a power source VD and a ground GND. A terminal of the coil 1 is connected, for example, to the ground GND, and the half bridge circuit 2 supplies or stops power to the coil 1.

Gates of the GaN elements 3, 4 are respectively connected to control circuits 5, 6. The control circuit 5 may have the same structure as the control circuit 6 or may have a structure of a conventional gate driving circuit. The control circuit 6 includes a negative power source circuit 13.

The gate of the GaN element 4 is connected to a gate driving circuit 8 via an input resistor 7. The gate driving circuit 8 outputs a gate driving signal to the GaN element 4 when receiving a command signal that instructs supplying or stopping power to the coil 1. As the gate driving circuit 8, for example, a general push pull circuit may be used. The gate driving circuit 8 is connected to a positive electrode terminal of a direct current (DC) power source 9, and is also connected to a negative electrode terminal of the direct current power source 9 via a capacitor 10 in series. The capacitor 10 is connected in parallel with a zener diode 11 in a polarity illustrated in FIG. 1. The zener diode 11 is a constant voltage diode that functions as a clamp circuit.

A negative electrode power source terminal of the gate driving circuit 8 is connected to the drain of the GaN element 4 via a diode 12 in a forward direction. The capacitor 10, the zener diode 11, the diode 12 form a negative power source circuit 13. The capacitor 10 functions as a negative power source when driving the gate driving circuit 8.

Next, an operation of the above-described structure will be described with reference to FIG. 2 and FIG. 3. Because the GaN elements 3, 4 function as switches that control the supply of power to the coil 1, the operations of the GaN elements 3, 4 are respectively indicated as switches SW1, SW2 in FIG. 2. Furthermore, changes of a drain-source voltage Vds of the GaN element 4 and a terminal voltage Vc of the capacitor 10 associated with on-off controls of the switches SW1, SW2 are also indicated in FIG. 2.

Figure 3:
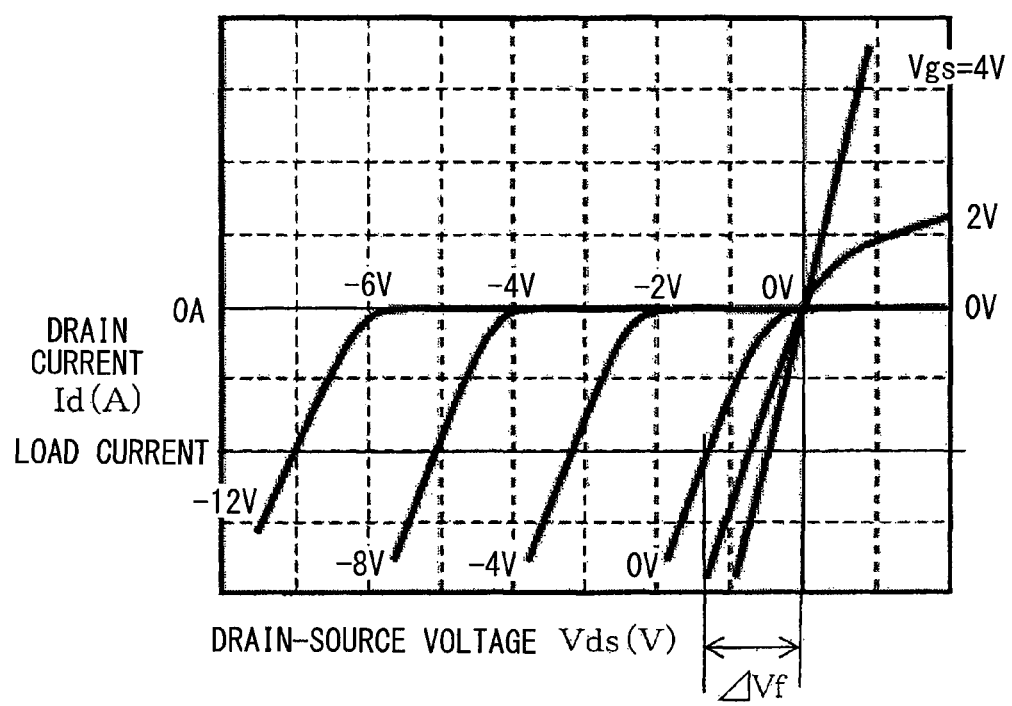
FIG. 3 is a diagram illustrating current-voltage characteristics of a GaN element.

FIG. 3 is a diagram illustrating operating characteristics of the GaN element 4 and indicates a gate voltage Vgs as a parameter. As shown in the figure, an IV characteristic of the GaN element on a reverse conducting side has such a characteristic that as the gate potential becomes a large negative potential, an offset voltage ΔVf of a drain potential increases by the same amount as the increase of the gate potential.

The half bridge circuit 2 supplies power to the coil 1 by complementarily driving the GaN elements 3, 4. The power supply to the coil 1 as the load is on the assumption that the GaN element 3 is turned on to supply a load current from the power source VD and the load current flows from a terminal 1a to a terminal 1b of the coil 1. In a period in which the load current is not supplied from the power source VD, there is a dead time period in which driving signals are not given from the gate driving circuit 8 to the GaN elements 3, 4. In order to hold an off-state, a negative voltage may be applied to the gate of the GaN element 4.

In the dead time period, the GaN element 4 in an off-state is reversely conducted by the load current of the coil 1, which is the inductive load, and the offset voltage Vf is generated. Due to the offset voltage Vf, electric current flows to the negative power source circuit 13 and the capacitor 10 for generating the negative voltage is charged via the diode 12.

Figure 2:
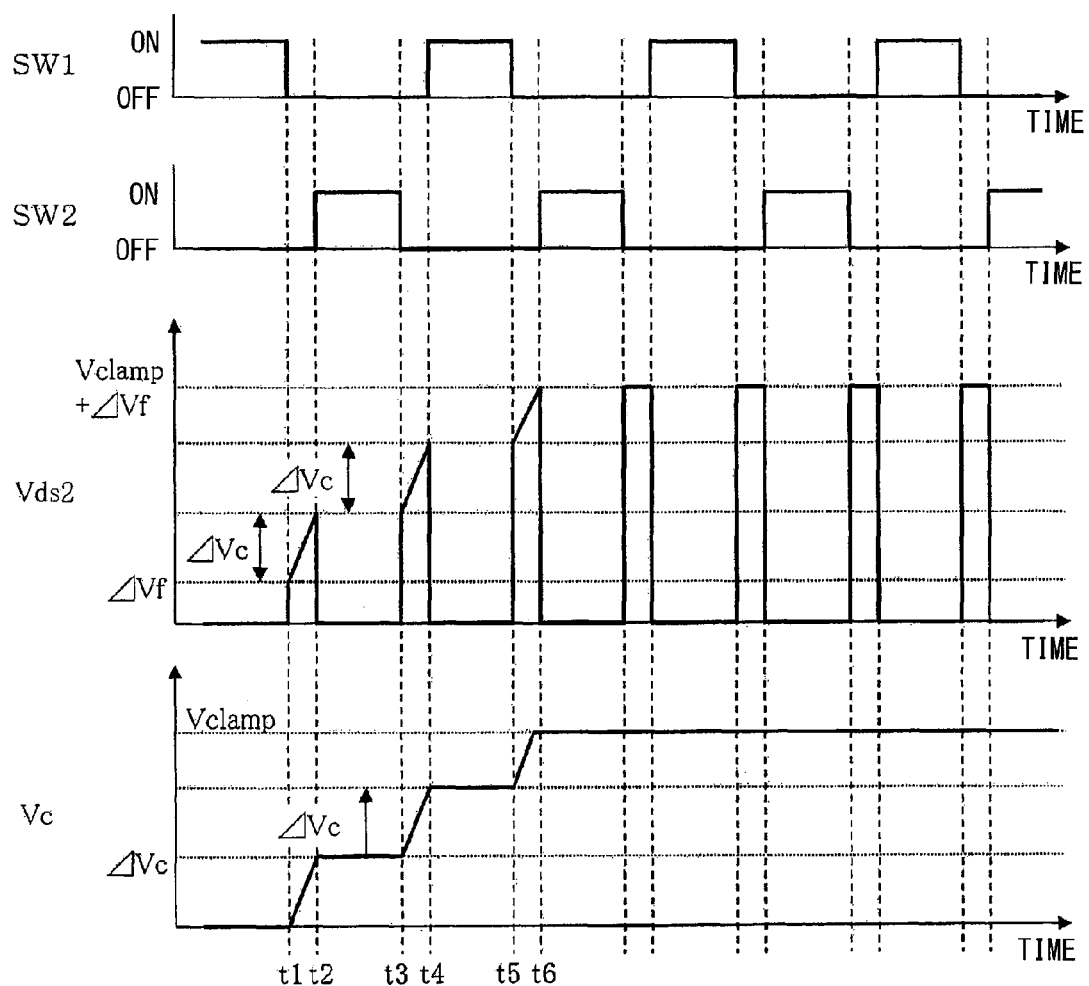
FIG. 2 is a timing diagram illustrating control states and voltage changes of respective parts.

The above-described situation is illustrated in FIG. 2. When it becomes a dead time period at t1, the drain-source voltage Vds2 of the GaN element 4 is reversely conducted due to the load current of the coil 1 and the offset voltage Vf is generated. In the dead time period from time t1 to t2, the capacitor 10 is charged via the diode 12 and the terminal voltage Vc of the capacitor 10 increases from 0 (V) to ΔVc (V). At an end point t2 of the dead time period, the drain-source voltage Vds2 of the GaN element 4 becomes Vf+ΔVc.

In the next dead time period from time t3 to t4, because the charge voltage Vc of the capacitor is added to the offset voltage Vf of the GaN element 4, the capacitor 10 is charged at a higher voltage. After that, each time the dead time period comes, the charging operation of the capacitor 10 is repeated.

Then, the charging operation is repeated and the terminal voltage Vc of the capacitor 10 reaches a zener voltage Vz of the zener diode 11, a further charge current is bypassed to the zener diode 11 and the charging operation to the capacitor 10 stops. At the time, the terminal voltage Vc of the capacitor 10 is clamped to the zener voltage Vz. Thus, in the present embodiment, the clamp voltage Vclamp is equal to the zener voltage Vz.

After the charging operation of the capacitor 10 is repeated and the terminal voltage Vc reaches the clamp voltage (=Vz), the clamp voltage Vclamp is applied as the negative potential to the negative power source terminal of the gate driving circuit 8. Accordingly, in the off-period of the GaN element 4, the negative potential can be applied as the gate potential, and the GaN element 4 becomes less likely to malfunction due to, for example, self-turning on.

In the first embodiment, the negative power source circuit 13 can be provided only by adding a simple circuit including the capacitor 10, the diode 12, and the zener diode 11 for clamping, without adding a power source circuit as a negative power source. Accordingly, a malfunction of the GaN element 4 as the semiconductor switching element due to, for example, self-turning on can be restricted.

(Second Embodiment)

Figure 4:
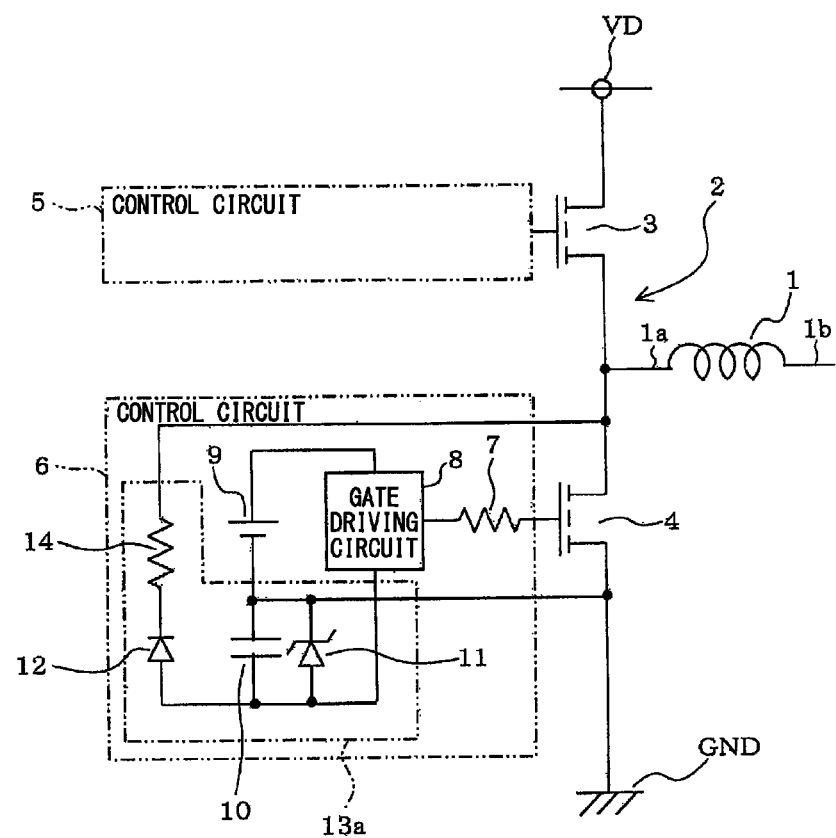
FIG. 4 is a diagram illustrating an electrical configuration of a second embodiment.

FIG. 4 illustrates a second embodiment of the present disclosure, and a part different from the first embodiment will be described below. As illustrated in FIG. 4, in a negative power source circuit 13a according to the present embodiment, a resistor 14 is connected in series with the diode 12. The resistor 14 is provided as a configuration for restricting an inrush current and functions as a time constant circuit when the capacitor 10 is charged. Accordingly, at a time point entering the dead time period, a generation of the inrush current, which is a charging current rapidly flowing to the capacitor 10, can be restricted.

Also in the second embodiment, the same effects as the first embodiment can be obtained. Furthermore, an excessive current is restricted from flowing as an inrush current in the charging operation to the capacitor 10.

(Third Embodiment)

Figure 5:
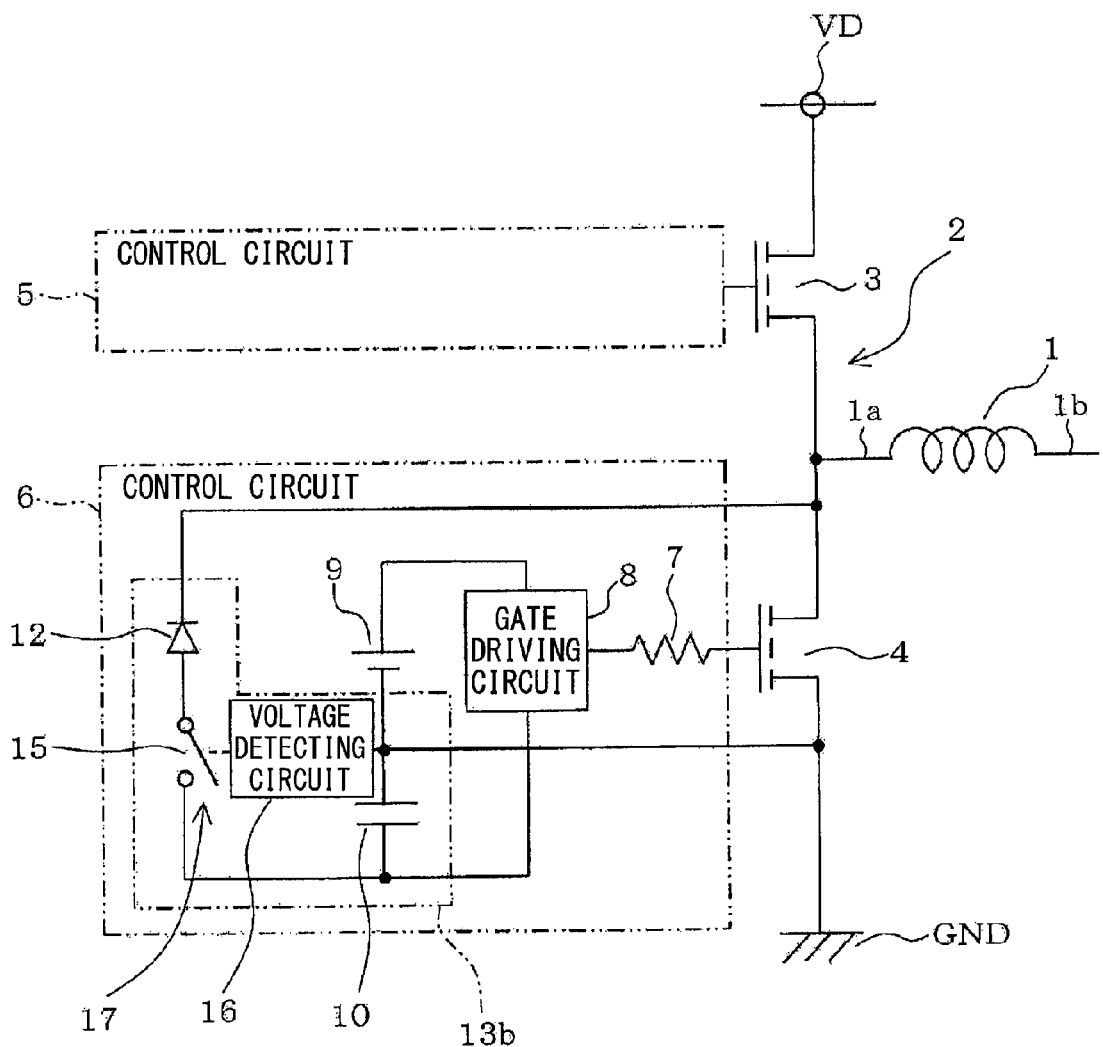
FIG. 5 is a diagram illustrating an electrical configuration of a third embodiment.

FIG. 5 illustrates a third embodiment of the present disclosure, and a part different from the first embodiment will be described below. As illustrated in FIG. 5, in the present embodiment, a clamp circuit 17 including a switching element 15 and a voltage detection circuit 16 is provided instead of the zener diode 11 that generates the clamp voltage Vclamp.

Specifically, as illustrated in FIG. 5, the switching element 15 is disposed between the capacitor 10 and the diode 12. The voltage detection circuit 16 monitors the terminal voltage Vc of the capacitor 10. The voltage detection circuit 16 determines whether the terminal voltage Vc of the capacitor 10 reaches the clamp voltage Vclamp. The voltage detection circuit 16 holds the switching element 15 in an on-state when the terminal voltage Vc of the capacitor 10 is lower than the clamp voltage Vclamp, and the voltage detection circuit 16 turns off the switching element 15 when the terminal voltage Vc of the capacitor 10 is equal to or higher than the clamp voltage Vclamp.

Accordingly, in a state where the terminal voltage Vc of the capacitor 10 is low, because the switching element 15 is held in the on-state by the voltage detection circuit 16, the capacitor 10 is charged with the load current during the dead time period in which the two GaN elements 3, 4 are in the off-state. Then, when the terminal voltage Vc of the capacitor 10 reaches the clamp voltage Vclamp by the charging operation, the voltage detection circuit 16 turns off the switching element 15. Accordingly, the charging path to the capacitor 10 is disconnected, the terminal voltage Vc of the capacitor 10 is held at the clamp voltage Vclamp, and the charging operation is not performed thereafter.

By providing the clamp circuit 17 including the switching element 15 and the voltage detection circuit 16, electric current does not flow to the capacitor 10 after the terminal voltage Vc of the capacitor 10 reaches the clamp voltage Vclamp, and therefore a power saving can be achieved.

(Fourth Embodiment)

Figure 6:
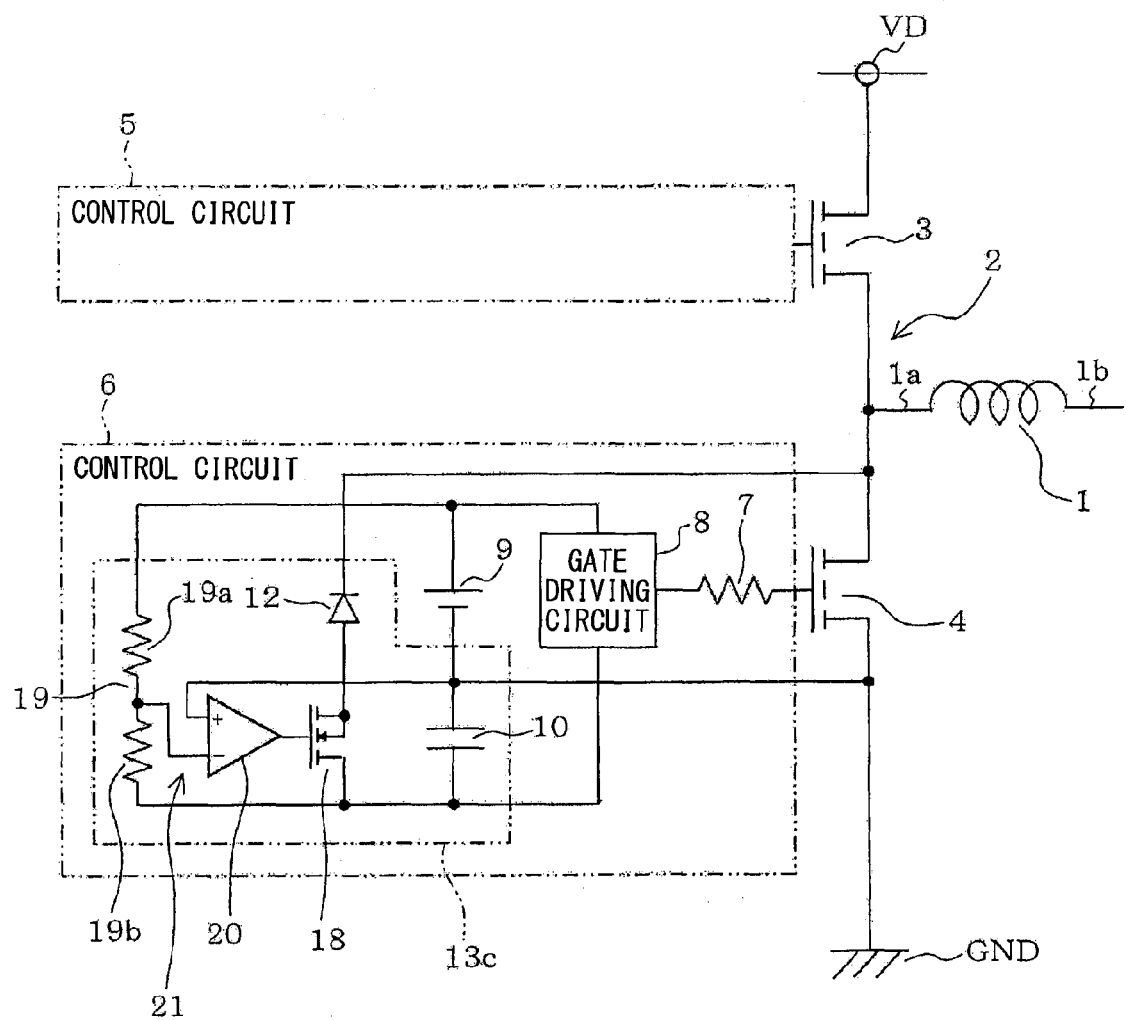
FIG. 6 is a diagram illustrating an electrical configuration of a fourth embodiment.

FIG. 6 illustrates a fourth embodiment of the present disclosure, and a part different from the third embodiment will be described below. In the present embodiment, a clamp circuit 21 is provided as a specific circuit configuration instead of the clamp circuit 17 described in the third embodiment.

As illustrated in FIG. 6, the clamp circuit 21 includes a transistor 18 formed of a p-channel type FET, instead of the switching element 15. In addition, the clamp circuit 21 includes a voltage dividing circuit 19 in which resistors 19a, 19b are connected in series and a comparator (comparison circuit) 20, instead of the voltage detection circuit 16. The comparator 20 may be a hysteresis comparator. The voltage dividing circuit 19 is connected between power source terminals of the gate driving circuit 8 so as to apply a terminal voltage of the resistor 19b to an inversion input terminal (−) of the comparator 20 as the clamp voltage Vclamp. A non-inversion input terminal (+) of the comparator 20 is connected so as to be applied with the terminal voltage Vc of the capacitor 10. An output terminal of the comparator 20 is connected to a gate of the transistor 18. The transistor 18, the voltage dividing circuit 19, and the comparator 20 form the clamp circuit 21.

In the charging operation to the capacitor 10, the comparator 20 outputs a signal to turn on the transistor 18 in a state where the terminal voltage Vc of the capacitor 10 is lower than the clamp voltage Vclamp. Accordingly, the charging path to the capacitor 10 is formed, and the charging operation to the capacitor 10 is performed during the dead time period in which the GaN elements 3, 4 are in the off-state.

Then, when the terminal voltage Vc of the capacitor 10 reaches the clamp voltage Vclamp, the comparator 20 inverts an output state of the signal to turn off the transistor 18. Accordingly, the charging path to the capacitor 10 is disconnected, and a further charging operation to the capacitor 10 is stopped Thus, also by the fourth embodiment, the same effects as the third embodiment can be obtained.

(Fifth Embodiment)

Figure 7:
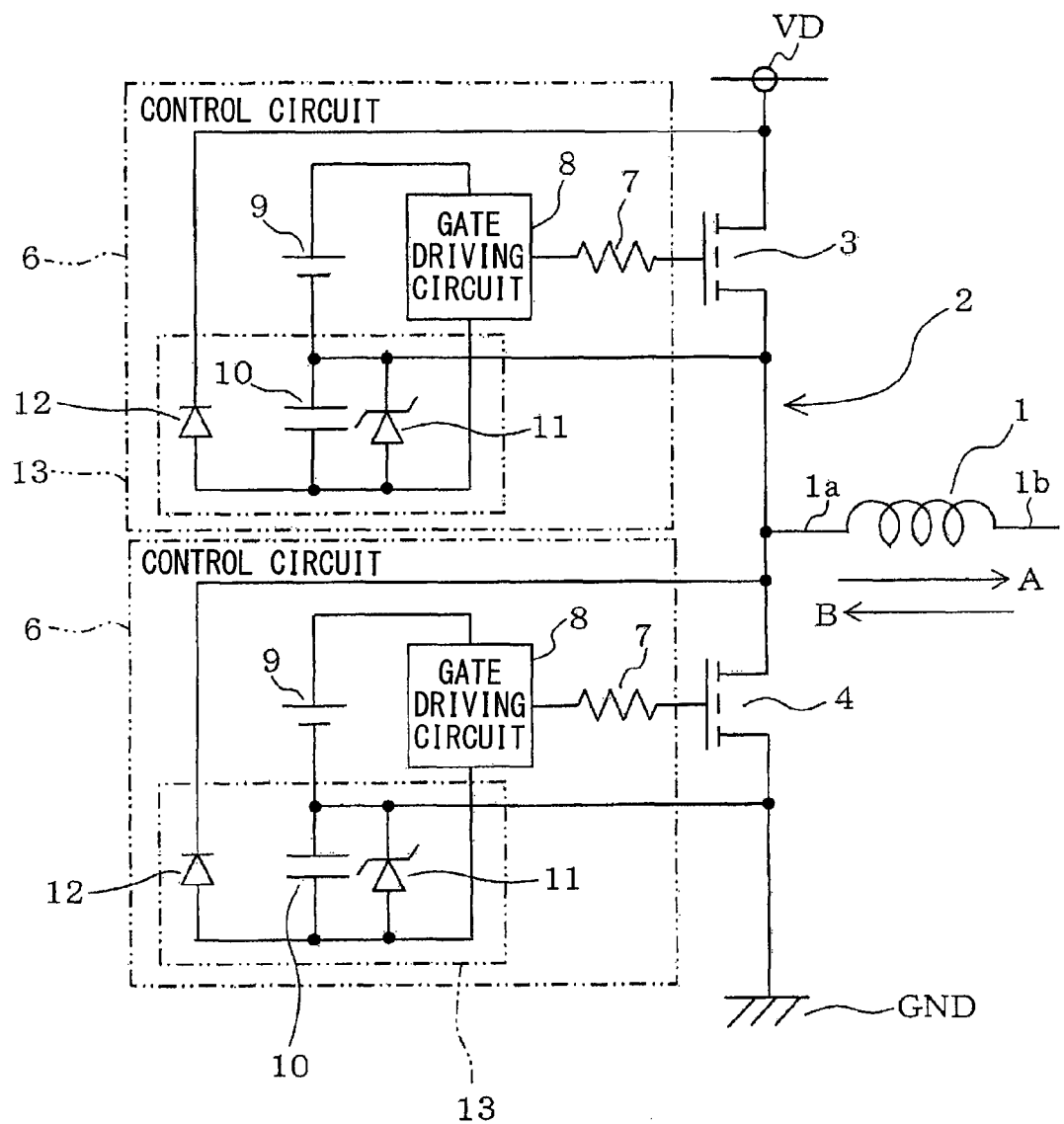
FIG. 7 is a diagram illustrating an electrical configuration of a fifth embodiment.

FIG. 7 illustrates a fifth embodiment of the present disclosure, and a part different from the first embodiment will be described below. In the present embodiment, the control circuit 6 is provided to both of the GaN elements 3, 4 used as the semiconductor switching elements.

In the present embodiment, as illustrated in FIG. 7, it is assumed that a load current flows to the coil 1 in two directions shown by arrows A, B. In other words, the half bridge circuit 2 described in the first embodiment is connected to the terminal 1a of the coil 1, and an equivalent half bridge circuit 2 is connected to the terminal 1b of the coil 1. Accordingly, the terminals 1a, 1b of the coil 1 can be switchably connected to the power source VD level to the ground GND level.

Because of the above-described configuration, in a case where the load current of the coil 1 flows in the direction shown by the arrow A, the control circuit 6 driving the GaN element 4 can secure the negative power source by the negative power source circuit 13. On the other hand, in a case where the load current of the coil 1 flows in the direction shown by the arrow B, the control circuit 6 driving the GaN element 3 can secure the negative power source by the negative power source circuit 13.

Thus, also by the fifth embodiment, the same effects as the first embodiment can be obtained. Furthermore, also in the control circuit 6 connected to the GaN element 3, the same effects can be obtained to the load current that flows to the coil 1 in the direction shown by the arrow B.

(Sixth Embodiment)

Figure 8:
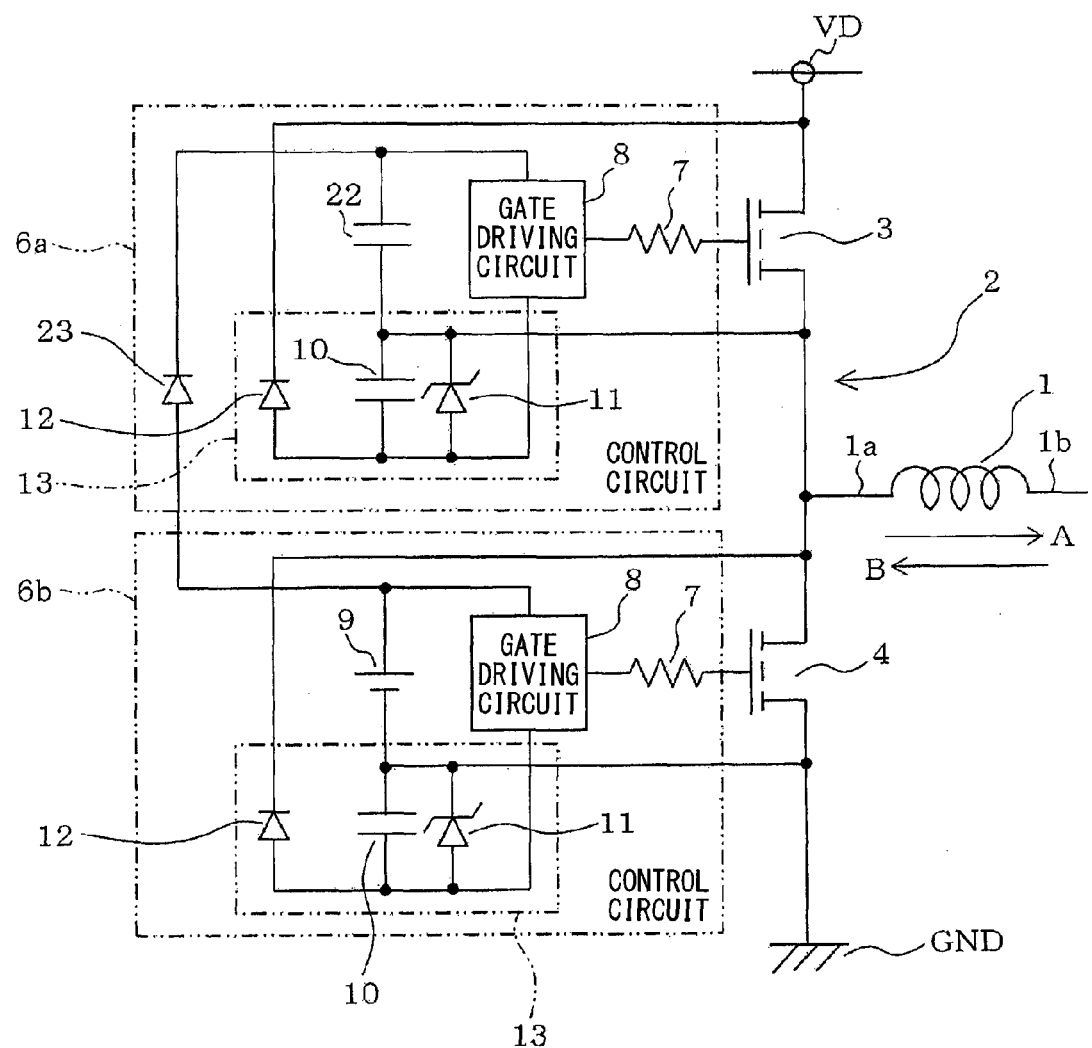
FIG. 8 is a diagram illustrating an electrical configuration of a sixth embodiment.

FIG. 8 illustrates a sixth embodiment of the present disclosure, and a part different from the fifth embodiment will be described below. In the present embodiment, a control circuit 6a, in which a direct current power source 9 is not provided, is provided instead of the control circuit 6 connected to the GaN element 3 in the fifth embodiment, and a control circuit 6b to the GaN element 4 that supplies power to the control circuit 6a is provided. The control circuit 6b has a configuration similar to the control circuit 6 described in the fifth embodiment, except for a function of supplying power to the control circuit 6a.

As illustrated in FIG. 8, the control circuit 6a is connected to a power source capacitor 22 instead of the direct current power source 9. The power source capacitor 22 is connected so as to be charged from a positive terminal of the direct current power source 9 in the control circuit 6b through a diode 23 in a forward direction. Accordingly, the control circuit 6a can operate similarly to the control circuit 6b by receiving power from the direct current power source 9 in the control circuit 6b, without the direct current power source 9 in the control circuit 6a or another power source circuit.

Furthermore, because the negative power source circuit 13 for the GaN element 3 is provided, in a case where the load current of the coil 1 flows in the direction shown by the arrow B, the negative power source can be generated by the charging operation of the capacitor 10 during the dead time period. Accordingly, the off gate voltage of the GaN element 3 can be applied as the negative power voltage, and the same effects as the fifth embodiment can be obtained.

(Other Embodiments)

While only the selected exemplary embodiments have been chosen to illustrate the present disclosure, it will be apparent to those skilled in the art from the present disclosure that various changes and modifications can be made therein without departing from the scope of the disclosure as defined in the appended claims.

For example, various clamp circuits that control the terminal voltage of the capacitor 10 to the clamp voltage can be used other than the clamp circuit 17 that includes the zener diode 11, the switching element 15, and the voltage detection circuit 16, and the clamp circuit 21 that includes the transistor 18, the voltage dividing circuit 19, and the comparator 20.

In the first to fourth embodiments, a normal MOSFET or a normal IGBT may be provided instead of the GaN element 3. The second embodiment can be applied to the third to sixth embodiments.

The third and fourth embodiments can be applied to the fifth and sixth embodiments. The semiconductor switching elements are not limited to the GaN elements described in the above embodiments and may be semiconductor switching elements that can be driven at a low voltage or semiconductor switching elements that require negative power source.

What is claimed is:

1. A control circuit of a semiconductor switching element comprising:
   a gate driving circuit driving the semiconductor switching element disposed on a power supply path of an inductive load; and
   a negative power source circuit connected between output terminals of the semiconductor switching element, the negative power source circuit including a series circuit of a capacitor and a diode in a forward direction connected from a negative potential side terminal to a positive potential side terminal of the output terminals, wherein
   a common connection point of the capacitor and the diode in the negative power source circuit is connected to a negative power source terminal of the gate driving circuit.

2. The control circuit according to claim 1, wherein the negative power source circuit further includes a clamp circuit restricting a terminal voltage of the capacitor from being equal to or higher than a clamp voltage.

3. The control circuit according to claim 2, wherein the clamp circuit includes a constant voltage diode.

4. The control circuit according to claim 2, wherein the clamp circuit includes a switching element and a voltage detection circuit,
   the switching element is disposed on a power supply path of the diode, and
   the voltage detection circuit detects the terminal voltage of the capacitor, holds the switching element in an on-state when a detected voltage is lower than the clamp voltage, and turns off the switching element when the detected voltage is equal to or higher than the clamp voltage.

5. The control circuit according to claim 4, wherein the switching element is configured to be turned on or off by a control signal,
   the voltage detection circuit includes a reference voltage generation circuit and a comparison circuit,
   the reference voltage generation circuit generates a reference voltage corresponding to the clamp voltage, and
   the comparison circuit compares the terminal voltage of the capacitor with the reference voltage and outputs the control signal to turn on or off the switching element based on a comparison result.

6. The control circuit according to claim 1, wherein the semiconductor switching element is a normally-off gallium nitride element.

7. The control circuit according to claim 1, further comprising
   a resistor connected in series with the negative power source circuit to restrict an inrush current.

8. The control circuit according to claim 1, wherein the semiconductor switching element disposed on the power supply path of the inductive load includes a first semiconductor switching element and a second semiconductor switching element forming a half bridge circuit, and
   the gate driving circuit and the negative power source circuit are provided with respect to each of the first semiconductor switching element and the second semiconductor switching element.

9. The control circuit according to claim 8, wherein the first semiconductor switching element is disposed on a higher voltage side than the second semiconductor switching element, and
   a power of the gate driving circuit provided with respect to the first semiconductor switching element is supplied from a power source of the gate driving circuit provided with respect to the second semiconductor switching element.

10. The control circuit according to claim 1, wherein the output terminals of the semiconductor switching element include a drain and a source, and
    the negative power source circuit is respectively connected to the drain and the source of the semiconductor switching element.

* * * * *